US006756543B1

(12) United States Patent
Kaloustian

(10) Patent No.: US 6,756,543 B1
(45) Date of Patent: *Jun. 29, 2004

(54) ELECTRICAL PLUG CORD RETAINER UNIT

(76) Inventor: John M. Kaloustian, 45950 W. Main St., Northville, MI (US) 48167

( * ) Notice: Subject to any disclaimer, the term of this patent is extended or adjusted under 35 U.S.C. 154(b) by 0 days.

This patent is subject to a terminal disclaimer.

(21) Appl. No.: 10/313,565

(22) Filed: Dec. 6, 2002

(51) Int. Cl.[7] .................................................. H05K 5/03

(52) U.S. Cl. ........................... 174/67; 174/135; 174/59; 174/50; 174/58; 174/60; 439/147; 220/242; 220/3.8

(58) Field of Search ............................ 174/67, 135, 59, 174/58, 60; 220/242, 3.8; 439/147

(56) References Cited

U.S. PATENT DOCUMENTS

| | | | | | |
|---|---|---|---|---|---|
| 2,231,001 | A | | 2/1941 | Engstrom | 174/66 |
| 3,013,105 | A | | 12/1961 | Craig | 174/67 |
| 3,257,497 | A | | 6/1966 | Chase | 174/66 |
| 3,689,868 | A | * | 9/1972 | Ernest | 439/501 |
| 4,613,728 | A | | 9/1986 | Lathrop | 174/53 |
| 5,071,367 | A | | 12/1991 | Luu | 439/501 |
| 5,189,256 | A | | 2/1993 | Epple | 174/50 |
| 5,230,552 | A | | 7/1993 | Schipper et al. | 312/223.6 |
| 5,457,600 | A | | 10/1995 | Campbell et al. | 361/643 |
| 5,527,993 | A | | 6/1996 | Shotey et al. | 174/67 |
| 5,533,637 | A | * | 7/1996 | Williams, Jr. | 220/3.8 |
| 5,596,479 | A | | 1/1997 | Campbell et al. | 361/643 |
| 5,723,815 | A | | 3/1998 | Pena | 174/53 |
| 5,773,757 | A | | 6/1998 | Kenney et al. | 174/53 |
| 5,899,761 | A | | 5/1999 | Crane et al. | 439/142 |
| 5,912,432 | A | | 6/1999 | Thomas | 174/66 |
| 6,028,267 | A | * | 2/2000 | Byrne | 174/59 |
| 6,031,183 | A | | 2/2000 | Guerrieri | 174/67 |
| 6,329,597 | B1 | * | 12/2001 | Kaloustian | 174/67 |

* cited by examiner

*Primary Examiner*—Dean A. Reichard
*Assistant Examiner*—Anton Harris
(74) *Attorney, Agent, or Firm*—Brooks Kushman P.C.

(57) ABSTRACT

A plug-cord retainer outlet for use with a conventional wall outlet including at least one plug socket and a faceplate has a container portion and a cover portion. The container portion has an interior cavity formed therein for storing excess extension cord from a plug inserted into the at least one plug socket. The container portion also has a rear wall and a front wall. The rear wall has an opening formed therein to effectuate engagement with the wall outlet. The cover portion is intended for mating engagement with the container portion. The unit has at least one cord outlet notch formed there to allow a portion of the cord to extend therefrom. The unit also includes a latch mechanism to secure the container portion to the cover portion.

46 Claims, 7 Drawing Sheets

ELECTRICAL PLUG CORD RETAINER UNIT

TECHNICAL FIELD

The present invention relates generally to a plug-cord retainer unit for use in retaining and concealing electrical cords.

BACKGROUND OF THE INVENTION

Electrical extension cords (extension cords) are commonly used to supply electrical power to a remote location, i.e., to a place away from an electrical outlet, such as for electrical appliances, tools, and computers. Common problems associated with electrical extension cords and their use include, tangling of the cord, difficulty extending the cord, difficulty retracting and storing the cord, and unsightliness of cords and their storage containers.

Prior art retractable electrical extension cord devices have attempted to solve some of these problems. Some of these devices include a spool for winding an electrical extension cord. The spool, which may be disposed in a housing, often includes a spring-loaded mechanism to aid in the winding and unwinding of the extension cord. Other prior known devices have used a manually rotatable spool to wind the electrical extension cord.

One such prior art device is disclosed in U.S. Pat. No. 5,773,757, which discloses a retractable cord apparatus. The retractable cord apparatus disclosed in the '757 patent is relatively bulky and unsightly. Moreover, while it provides advantages in preventing a single cord from becoming tangled due to the retraction mechanism, it does not solve the problem if more than one cord is required to be stored. Further, the retractable cord apparatus of the '757 patent is configured such that the rectangular shaped frame 12 is mounted within a wall by way of an opening formed therethough. The frame 12 is preferably mounted in the opening cut into the wall between a pair of vertical studs. The outermost surface of the frame preferably lies flush with the wall when installed such that the spool 36 is disposed behind the outer wall surface. This device is thus time consuming and relatively expensive to install in that it requires a permanent installation in the wall.

Thus, while these prior art electrical extension cord devices perform adequately in many circumstances, problems and shortcomings still exist. Moreover, the majority of these prior devices were intended for commercial use and are therefore not applicable for residential use. Further, prior art electrical extension cord devices generally are inconvenient, difficult to use, unstable, unsightly, and relatively expensive. Additionally, none of the devices may be easily mounted or used with power strips or other electrical connections that occur away from a wall where a typical electrical outlet resides.

SUMMARY OF THE PRESENT INVENTION

Accordingly, it is an object of the present invention to provide a plug-cord retainer unit that allows for the storage of excess cord length in an attractive and efficient manner.

It is a further object of the present invention to provide a plug-cord retainer unit that can be utilized with outlets having a varying number of plugs.

It is another object of the present invention to provide a plug-cord retainer unit that can be readily secured to and removed from a conventional wall outlet.

It is still another object of the present invention to provide a plug-cord retainer unit that can be integrally formed with a conventional wall outlet.

In accordance with the above and other objects of the present invention, an electrical plug-cord retainer unit is disclosed. The plug-cord retainer unit is disposed around a conventional wall outlet having at least one plug socket and a faceplate. The plug-cord retainer unit has a container portion and a cover portion. The container portion has an interior cavity formed therein for storing any excess extension cord from a plug inserted into the at least one plug socket. The container portion also has a rear wall and a front wall. The rear wall has an opening formed therein to effectuate engagement with the wall outlet. The cover portion is intended for mating engagement with the container portion. The unit has at least one cord outlet notch formed therein to allow a portion of the cord to extend therefrom. The unit also includes a latch mechanism to secure the container portion to the cover portion.

These and other features and advantages of the present invention will become apparent from the following description of the invention, when viewed in accordance with the accompanying drawings and appended claims.

DETAILED DESCRIPTION OF THE PREFERRED EMBODIMENTS

Figure 2:
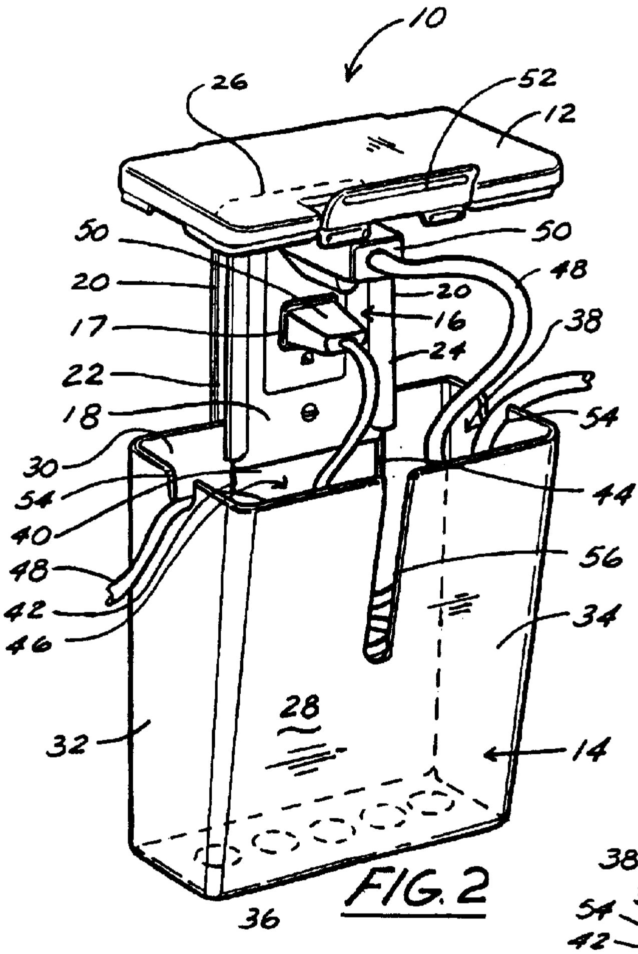
FIG. 2 is a schematic illustration of the plug-cord retainer unit of FIG. 1 in an open position with plugs inserted into a respective plug socket of a conventional wall outlet in accordance with a preferred embodiment of the present invention.
Figure 1:
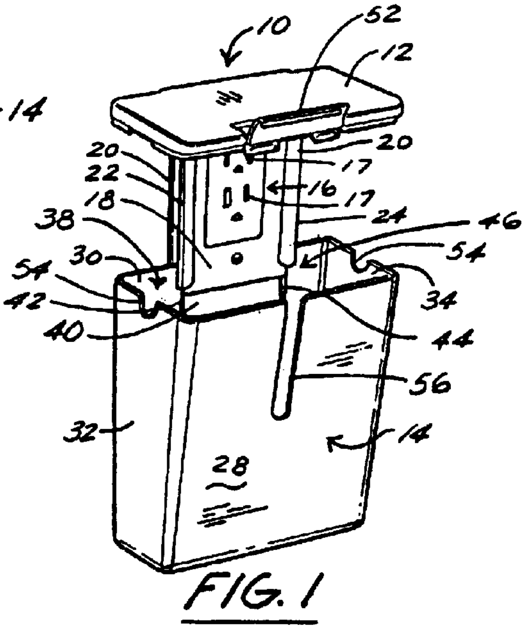
FIG. 1 is a schematic illustration of a preferred embodiment of a plug-cord retainer unit in an open position in accordance with a preferred embodiment of the present invention.
Figure 3:
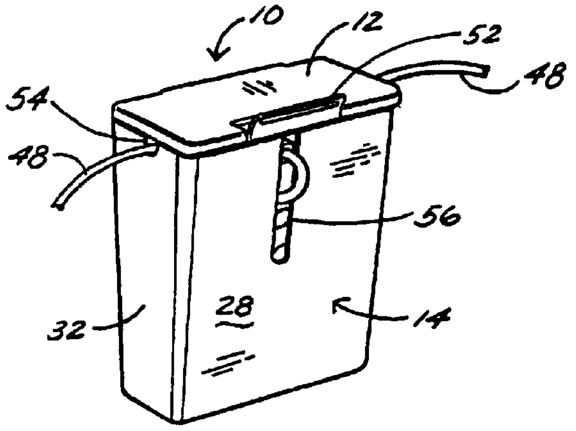
FIG. 3 is a schematic illustration of the plug-cord retainer unit of FIG. 1 in a closed position in accordance with a preferred embodiment of the present invention.

Referring now to FIGS. 1 through 3, an embodiment of a plug-cord retainer unit 10 in accordance with the present invention is illustrated. The plug-cord retainer unit 10 preferably includes a cover portion 12 and a container portion 14 which are each in communication with a conventional wall outlet 16, as discussed in more detail below. The wall outlet 16 is preferably a conventional wall outlet with two plug sockets 17. However, outlets with more or less plug sockets may also be utilized. Further, the wall outlet 16 preferably has a faceplate 18 that has a slot 20 located on each side 22, 24 thereof. The slots 20 are preferably integrally formed with the faceplate 18, such that the faceplate 18 may simply replace an existing faceplate. Alternatively, the slots 20 may be formed as separate pieces that can be secured to an existing faceplate 18. In either case, the work required to make the faceplate 18 compatible with the plug-cord retainer unit 10 is minimal. While the disclosed embodiments are discussed primarily in connection with wall outlets with plug sockets, it should be understood that the disclosed retainer units may be utilized to house communication wires and associated computer wires and thus can be mounted around phone jacks, network connections and other similar connections.

In one preferred embodiment, the cover portion 12 is secured or otherwise fixed to a top portion 26 of the faceplate 18. The container portion 14 has a front wall 28, a back wall 30, a pair of opposing sidewalls 32, 34, a bottom wall 36, and an open top 38. The back wall 30 has an opening 40 formed therein. The opening 40 has a pair of opposing side portion 42, 44 which preferably engage the slots 20 located on the opposing sides 22, 24 of the faceplate 18. The opening 40 is sized at least as large as the faceplate 18 so that the container portion 14 can engage the cover portion 12, as shown in FIG. 3, without interference with from the faceplate 18 as it moves from an open position to the closed position. That is, the faceplate 18 fits entirely within the opening 40, when the plug-cord retainer unit 10 is in the closed position. As used herein, the term open position means that the unit is configured such that the plug sockets are exposed and the term closed position means that unit is configured such that the plug sockets are covered.

As shown in FIG. 2, the container portion 14 has an interior cavity 46 which is defined by the front wall 28, the back wall 30, the pair of opposing side walls 32, 34, the bottom wall 36, and the open top 38. The interior cavity 46 is intended to receive excess portions of the one or more extension cords 48 extending from a respective plug 50 inserted into the plug socket 17 of the outlet 16. The interior cavity 46 thus, houses loose or excess cords and keeps them out of the way in order to provide a more aesthetically pleasing work area as well as to cover the outlet for safety purposes. The container portion 14 is slideable between an open position, where the plug sockets 17 are exposed (FIGS. 1 and 2), and a closed position, where the plug sockets are covered (FIG. 3), as the opposing side portions 42, 44 of the opening 40 slide within the slots 20 in the direction of the arrow in FIG. 2. At all times the loose or excess cords are housed by the container portion 14 whether or not it is in the open position or the closed position.

In the closed position, the container portion 14 engages the cover portion 12 and is preferably retained in place by a snap latch 52 or other latch mechanism such that the excess cords are stored within the cavity 46. Alternatively, the container portion 14 may be locked to the cover portion 12 by a locking mechanism to prevent unwanted entry, such as with a computer network server or other electrical apparatus that must remain plugged in at all times. The opposing sidewalls 32, 34 each preferably have a cord outlet notch 54 formed therein to each allow a portion of the respective extension cord 48 to extend from the container portion 14 when the retainer unit is in a closed position. Additionally, the container portion 14 may have one or more slots 56 formed through the front wall 28 to allow large rigid cord ends to flex therethrough as necessary. Further, a plurality of vent/drain holes 58 are preferably formed in the bottom wall 36 of the container portion 14 to prevent overheating and allow any accumulated fluid to escape the interior cavity 46 and thus spill to the drain. Alternatively, the holes 58 may also allow the cords 48 to pass through the bottom wall 36. The notches may alternatively be formed in other locations in the container portion 14 or in the cover portion 12.

Figure 4:
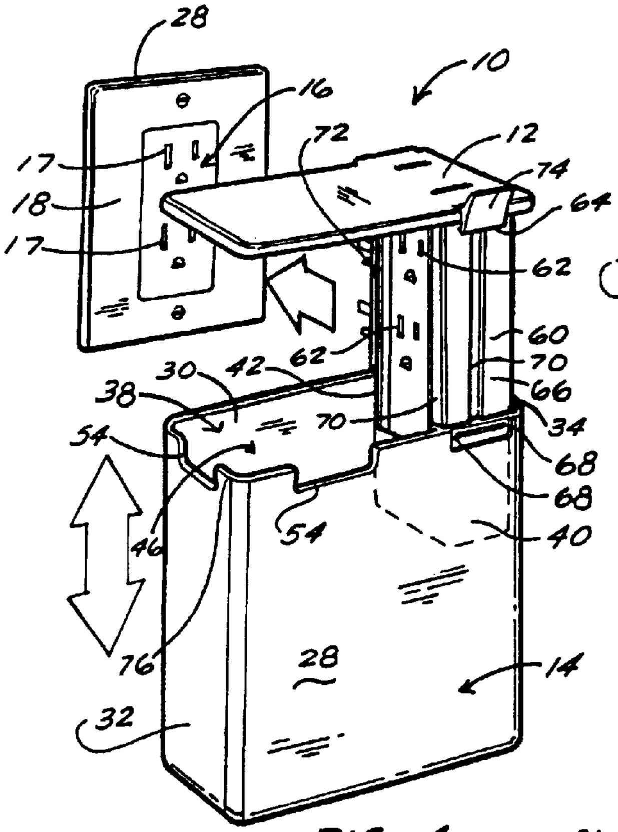
FIG. 4 is a schematic illustration of another preferred embodiment of a plug-cord retainer unit in an open position and exploded from the wall outlet in accordance with a preferred embodiment of the present invention.
Figure 5:
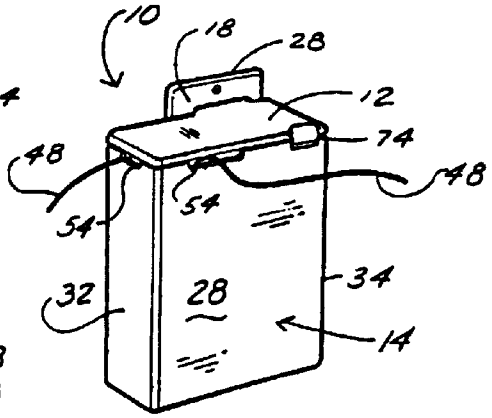
FIG. 5 is a schematic illustration of the plug-cord retainer unit of FIG. 4 in a closed position in accordance with a preferred embodiment of the present invention.

FIGS. 4 and 5 illustrate another embodiment of a plug-cord retainer unit 10 in accordance with the present invention. The portions of this embodiment and other embodiments described below that are the same as the prior embodiment shown and described above are labeled with the same reference numbers for convenience. In this embodiment, the plug-cord retainer unit 10 includes a cover portion 12, a container portion 14, and a plug block 60 interconnecting the cover portion 12 with the container portion 14. The plug block 60 is preferably a commercially available plug block 60 that plugs into both the plug sockets 17 of the conventional wall outlet 16. In the preferred embodiment, the plug block 60 with prongs is only single sided with two exposed plugs 62, however, it should be understood that the plug-block may be double sided or more and may include six to eight outlets.

As shown in FIG. 4, the cover portion 12 is secured to an upper portion 64 of the plug block 60 while the container portion 14 is secured to a lower portion 66 of the plug block 60. However, the plug block 60 may be secured or attached to the cover portion 12 and the container portion 14 at a variety of other locations. The container portion 14 has one or more rails 68 that engage a respective slot 70 formned in the plug block 60. The rails 68 are preferably formed in the front wall 28 of the container portion 14. The rails 68 may alternatively or additionally be formed in the sidewall 34 or other portions of the container portion 14. The back wall 30 of the container portion 14 preferably has an opening 40 formed therein that allows the back wall 30 to fit around the plug block 60 as the container portion 14 is moved from an open position to a closed position. The opposing side portions 42 of the opening 40 each preferably engage and slide along a respective rear slot 72 formed in the plug block 60. The engagement of the container portion 14 to the plug block 60 allows the container portion 14 to be slid from the open position (FIG. 4) to the closed position (FIG. 5), as shown by the arrow. The container portion 14 may be retained on the plug block 60 so that they remain connected even in the open position or may alternatively be allowed to separate. Alternatively, the side wall 34 in FIG. 5 may have one or more outlets, which are exposed when the unit is in the closed position. This allows for interim use of the unit when there is not a cord stored therein. Alternatively, the exposed outlets could allow for the connection of a large device such as a voltage transformer.

A plurality of plug cords may be stowed in the cavity 46 formed in the container portion 14, as discussed above. The cords may be easily accessed when the container portion 14 is in the open position. In the closed position, the container portion 14 is secured to the cover portion 12 by a snap lock 74 or other suitable attachment mechanism, so that the excess or loose cords are hidden in the cavity to provide an aesthetically pleasing look. Further, in the closed position, the cords 48 may extend out of respective notches 54 formed in the upper periphery 76 of the container portion 14. Obviously, the notches 54 may be formed in other portions of the container portion 14 or may alternatively be formed in the cover portion 12. Preferably, one or more plugs are inserted into the plug block 60 and the container portion 14 is locked to the cover portion 12 prior to attachment of the plug-cord retainer unit 10 to the wall outlet 16. Alternatively, the retainer unit 10 may be attached to the wall outlet 16 prior to moving the container portion 14 to the closed position or prior to the attachment of any plugs to the plug block 60.

Figure 6:
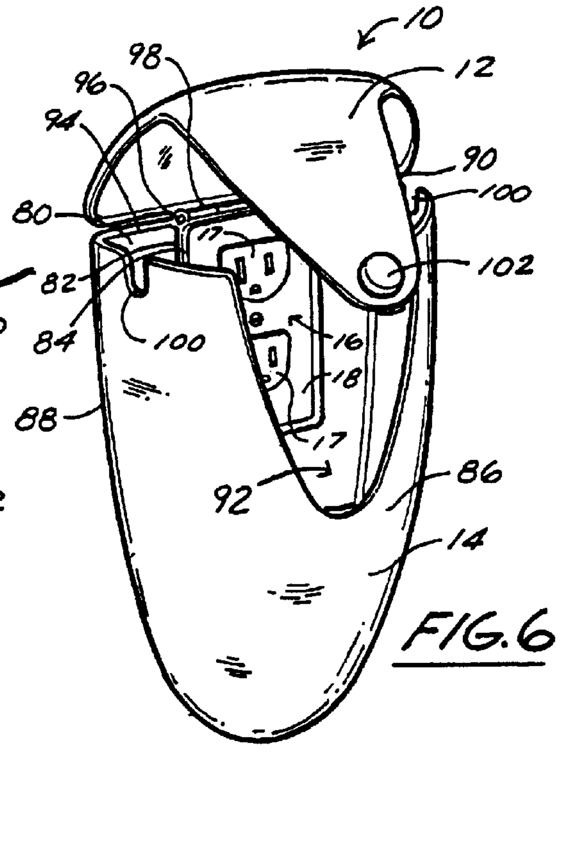
FIG. 6 is a schematic illustration of another embodiment of a plug-cord retainer unit in an open position in accordance with a preferred embodiment of the present invention.
Figure 7:
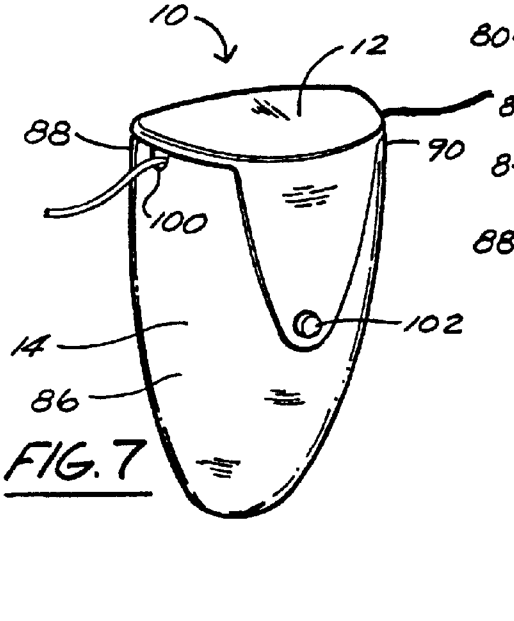
FIG. 7 is a schematic illustration of the plug-cord retainer unit of FIG. 6 in an open position in accordance with a preferred embodiment of the present invention.

Referring now to FIGS. 6 and 7, which illustrate another embodiment of a plug-cord retainer unit 10 in accordance with the present invention. The plug-cord retainer unit 10 includes a cover portion 12 and a container portion 14 which are each in communication with a conventional wall outlet 16 having a faceplate 18, as discussed in more detail below. The wall outlet 16 is preferably a conventional wall outlet with two plug sockets 17, however, as discussed above, outlets with multiple plug sockets may also be utilized. In this embodiment, the container portion 14 has a generally tear drop shape with a generally flat rear wall 80. The rear wall 80 preferably lies flush with the wall on which the wall outlet 16 is located. The rear wall 80 has an opening 82 formed therein that is bigger than the dimension of the faceplate 18, such that the rear wall 80 may be snugly disposed around the periphery 84 of the faceplate 18. The rear wall 80 is preferably secured to the faceplate 18 or may alternatively be secured to the wall surrounding the faceplate 18. Alternatively, the faceplate 18 may be integrally formed with the rear wall 80 and may thus be secured directly to the wall outlet 16. The container portion 14 has a front wall 86 that extends from a first edge 88 of the rear wall 80 to a second opposing edge 90 of the rear wall 80.

The cover portion 12 is preferably hingeably attached to the container portion 14 such that it may be rotated between an open position exposing the plug sockets 17 as well as an interior cavity 92 of the container portion, as shown in FIG. 6, to a closed position where the plug sockets 17 are covered, as shown in FIG. 7. The cover portion 12 preferably has hinges 96 located along an upper periphery 94 of the container portion 14 and more preferably along the rear wall 80 and at the corners 98 of the faceplate 18. Alternatively, the hinges may be secured to the top surface 26 of the faceplate 18. The interior cavity 92 of the container portion 14 is intended to store excess extension cords of plugs inserted into the plus sockets 17. The excess cords are stored and retained in container portion 14 regardless of whether cover portion 12 is rotated in the open position or the closed position. The upper periphery 94 of the container portion 14 preferably has a plurality of cord outlet notches 100 formed therein for allowing the cords 48 to extend therethrough when the cover portion 12 is rotated to the closed position. In the closed position, the cover portion 12 is preferably secured to the container portion 14 by a snap latch 102 or other similar attachment mechanism, as will be understood by one of skill in the art.

Figure 8:
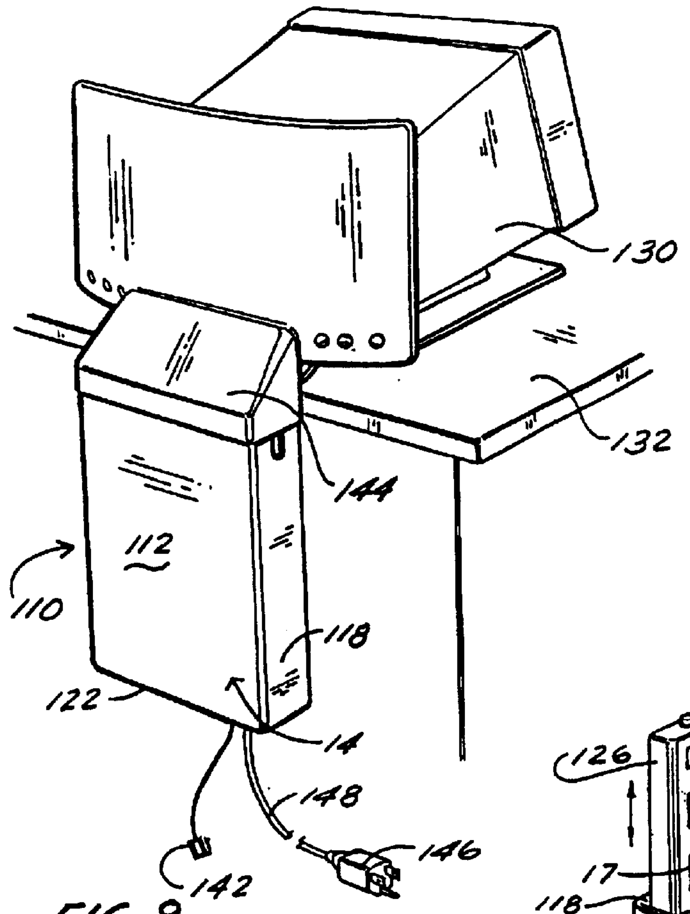
FIG. 8 is a schematic illustration of a preferred embodiment of a plug-cord retainer unit attached to a computer system for managing electronics cords in accordance with a preferred embodiment of the present invention.
Figure 9:
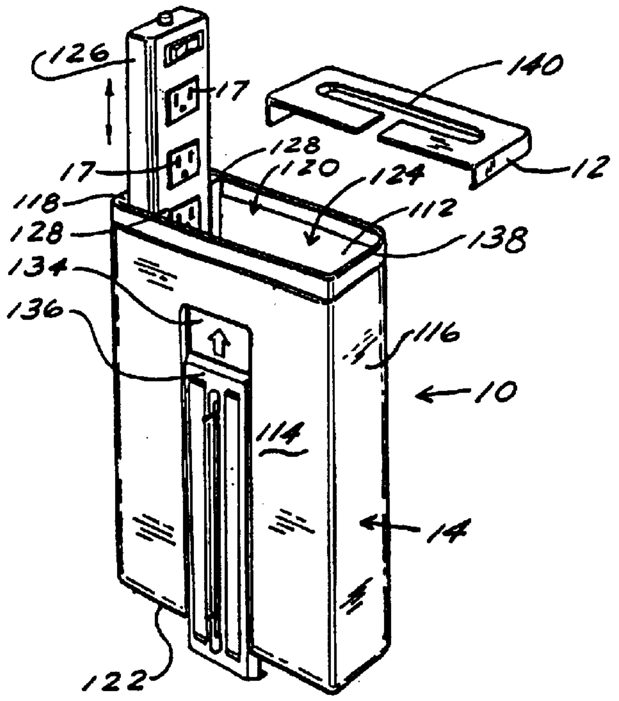
FIG. 9 is an exploded view of the plug-cord unit of FIG. 8.

Referring now to FIGS. 8 and 9, which illustrate an embodiment of a plug-cord retainer unit 110 for use in managing electronics wiring or cords. The plug-cord retainer unit 110 preferably has a cover portion 12 and a container portion 14. In this embodiment, the container portion 14 is preferably generally rectangular in shape and has a front surface 112, a rear surface 114, a pair of opposing side surfaces 116, 118, an open top 120, and a bottom portion 122. It should be understood that the container portion 14 may take on a variety of shapes in each of the disclosed embodiments. These surfaces define an interior cavity 124 into which a communications and power module 126 is preferably disposed. The communications and power module 126 is preferably located along one of the opposing side surfaces 116, 118 such that the plug sockets 17 and other ports face the interior cavity 124. Each of the front and rear surfaces 112, 114 preferably has a track flange 128 molded therein to keep the communications and power module 126 in place. Moreover, the container portion 14 is preferably formed so that the distance between the front surface 112 and the rear surface 114 is only slightly larger than the width of a commercially available communications and power module 126 to keep it maintained snugly therein.

As shown, the plug-cord retainer unit 110 is preferably utilized with a computer system 130 by securing it to a desk 132 upon which the computer system 130 is located or, alternatively, to the computer system 130 itself. The rear surface 114 of the container portion 14 preferably has a recess 134 formed therein within which a mount track 136 is disposed. The mount track 136 is preferably attached to the desk 132 by screws, adhesive tape, magnetic tape or other similar device, which allow the container portion 14 to slide with respect to the mount track 134 exposing the communications and power module 126, to allow the connection of plugs and other communications equipment. This allows for the ability to plug and unplug wires and then situate them in the container portion 14 at a convenient height and then affix them in a storage position. Additionally, the communications and power module 126 may also be slideable into and out of the interior cavity 124, as shown by the arrow in FIG. 9. The cover portion 12 is preferably a grommet lid that fits over the outer periphery 138 of the open top 120. The grommet lid 12 has an opening 140 formed therein that allows cords to pass therethrough and electrically connect the communications and power module 126 to the computer system 130.

In the preferred embodiment, the communications and power module 126 is disposed in the container portion 14. Once the power module 126 is properly located, the plugs and other electrical connections, such as a phone jack 142 are attached to plug sockets 17 and a phone jack on the module 126, as is known in the art. The grommet lid 12 is then secured to the container portion 14 with the cords passing through the opening 130. The container portion 14 is then secured to the desk 132 or other structure via the mount track 136. Alternatively, the container portion 14 could be secured to the desk 132 prior to attachment of the plugs or other electrical connections to the communications and power module 126. Once all the electrical connections have been completed, a visual back screen 144 can be attached around the outer periphery 138 of the open top 120 to cover the grommet lid 12 and hide the cords and wires extending therefrom to provide a more aesthetically pleasing look. The plug-cord retainer unit 110 may also be utilized with a variety of other equipment.

The excess cords will thus be stored in the interior cavity 124 and the plug 146 and the cord 148 for the communications and power module 126 will extend through the bottom portion 122 of the container portion 14. Additionally, the other end of the phone jack 142 will also extend through the bottom portion 122 such that the phone jack and the plug 146 can be connected to conventional wall mounts. The bottom portion 122 may be open or, alternatively, may have a plurality of outlets or drain openings formed therethrough.

Figure 10:
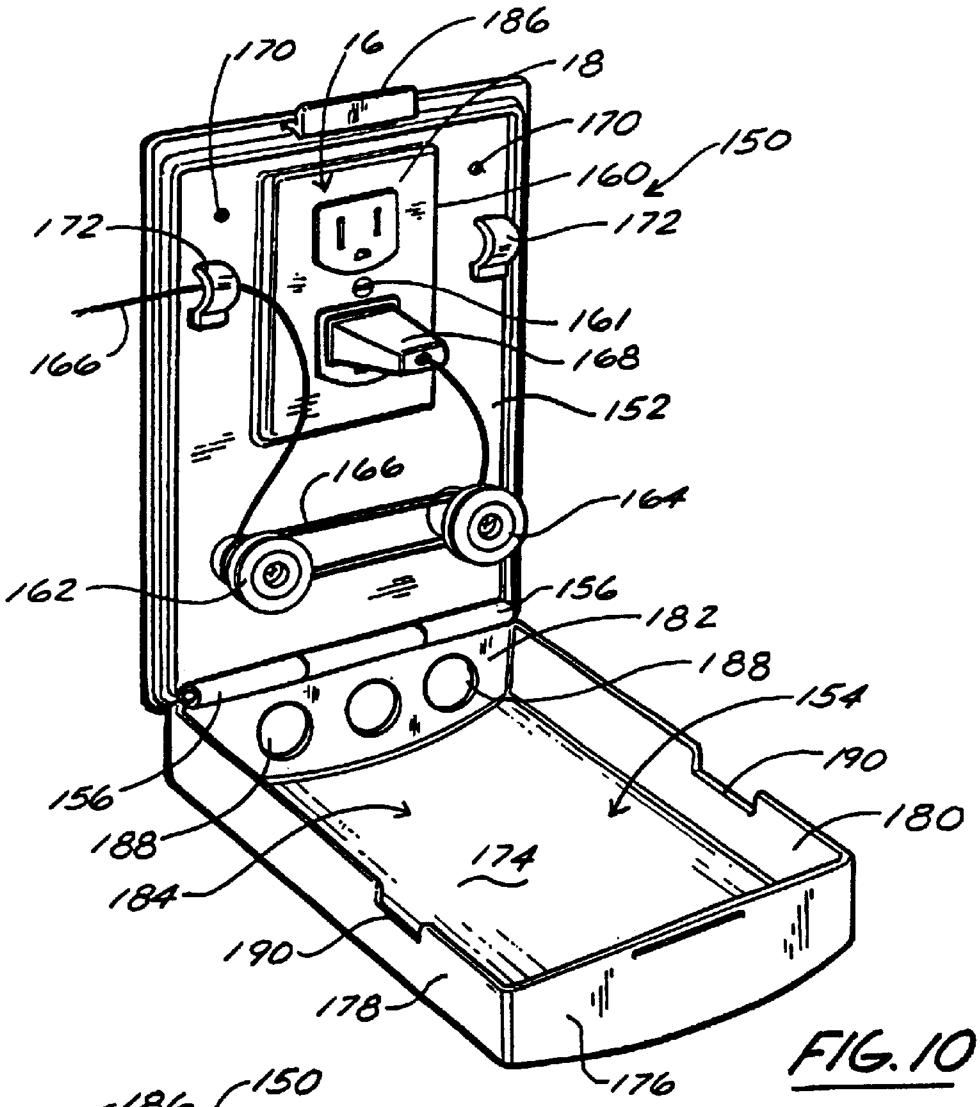
FIG. 10 is a schematic illustration of another embodiment of a plug-cord retainer unit in an open position in accordance with a preferred embodiment of the present invention.
Figure 11:
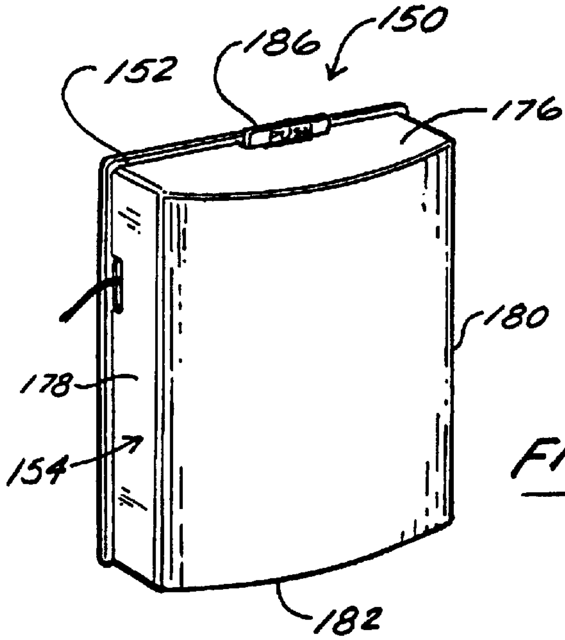
FIG. 11 is a schematic illustration of the plug-cord retainer unit of FIG. 10 in a closed position in accordance with a preferred embodiment of the present invention.

Referring now to FIGS. 10 and 11, which illustrate another embodiment of a plug-cord retainer unit 150 in accordance with the present invention. The plug-cord retainer unit 150 has a wall-mounting portion 152 and a cover portion 154 that is hingeably attached to the wall-mounting portion 152 through a plurality of hinges 156. The wall-mounting portion 152 is preferably generally rectangular in shape and is intended to fit around the faceplate 18 of a conventional wall outlet 16. The wall-mounting portion 152 has an opening 158 formed therein which is sized to fit around the periphery 160 of the faceplate 18 such that the wall mounting portion 152 may lie flat against the wall. Alternatively, the faceplate 18 may be molded integrally with the wall-mounting portion 152 and attached to the wall by a screw 161 through the wall outlet 16. The wall-mounting portion 152 may alternatively be secured to the wall by a plurality of screws 170.

The wall mounting portion 152 has a pair of cord wheel knobs 162, 164 that allow the excess cord 166 from a plug 168 inserted into the plug socket 17 to wrap therearound for storage. Two additional cord reel knobs (not shown) may also be attached to the wall mounting portion 152 generally at the location of the screws 170 shown in the drawing to allow excess cord from another plug to wrap therearound for storage. The wall mounting portion 152 preferably has a pair of cord clips 172 located on either side of the wall outlet 16 to retain the portion of the cord 166 therein that extends from the unit 150. The cord clips 172 may obviously be positioned in a variety of locations.

The cover portion 154 preferably has a front face 174, a top portion 176, a pair of opposing side portions 178, 180, and a bottom portion 182. The top portion 176, the pair of opposing side portions 178, 180 and the bottom portion 182 extend generally away from the front face 174 to form an interior cavity 184 within which the knobs 162, 164 and other components of the unit 150 can be retained when the cover portion 154 is moved to a closed position, as shown in FIG. 11, which covers the wall outlet 16. Each of the top portion 176, the pair of opposing side portions 178, 180 and the bottom portion 182 engage a respective peripheral portion on the wall mounting portion 152 which allows the unit to close and be retained by a snap latch 186 or other similar mechanism. The bottom portion 182 preferably has a plurality of vent/drain holes 188 formed therein. Additionally, each of the opposing side portions 178, 180 has a notch 190 formed therein to allow passage of the cord 166 therethrough when the cover portion 152 is in a closed position.

Figure 12:
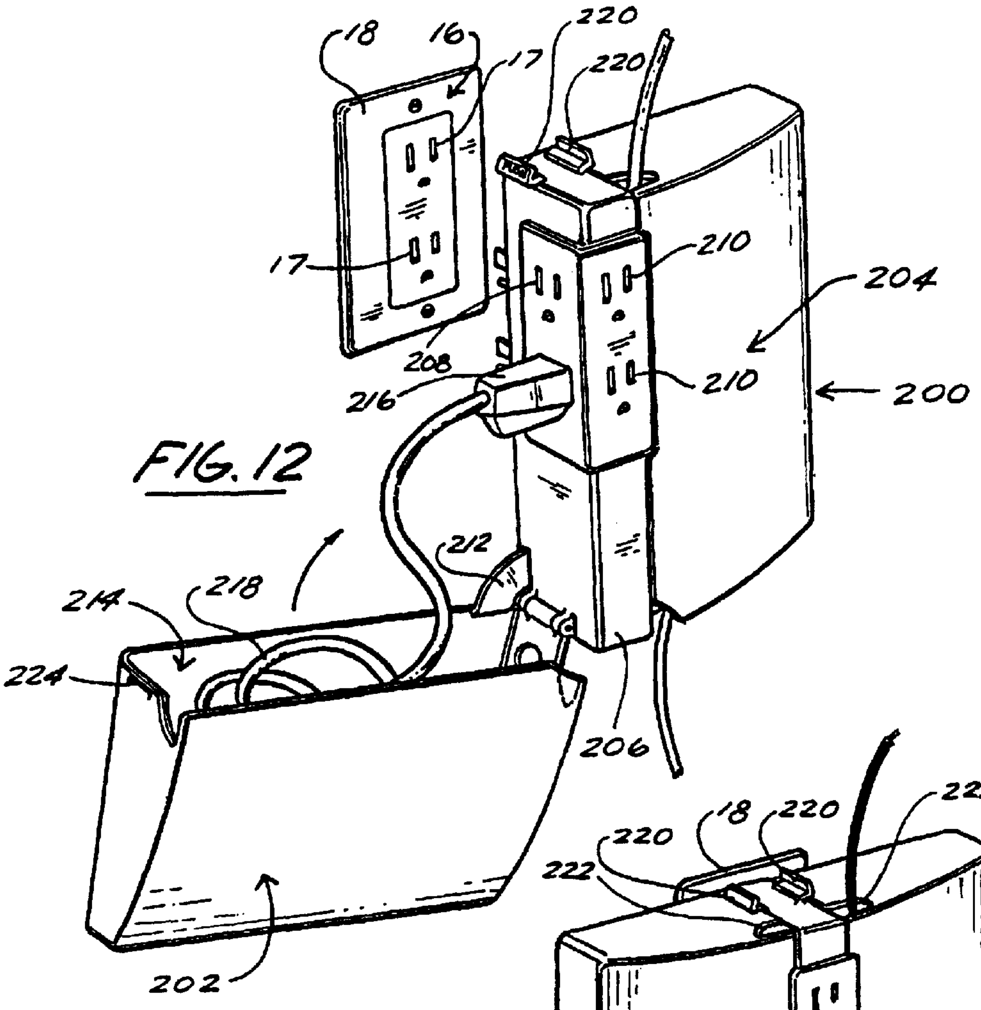
FIG. 12 is a schematic illustration of another embodiment of a plug-cord retainer unit in a partially open position and exploded from the wall outlet in accordance with a preferred embodiment of the present invention.
Figure 13:
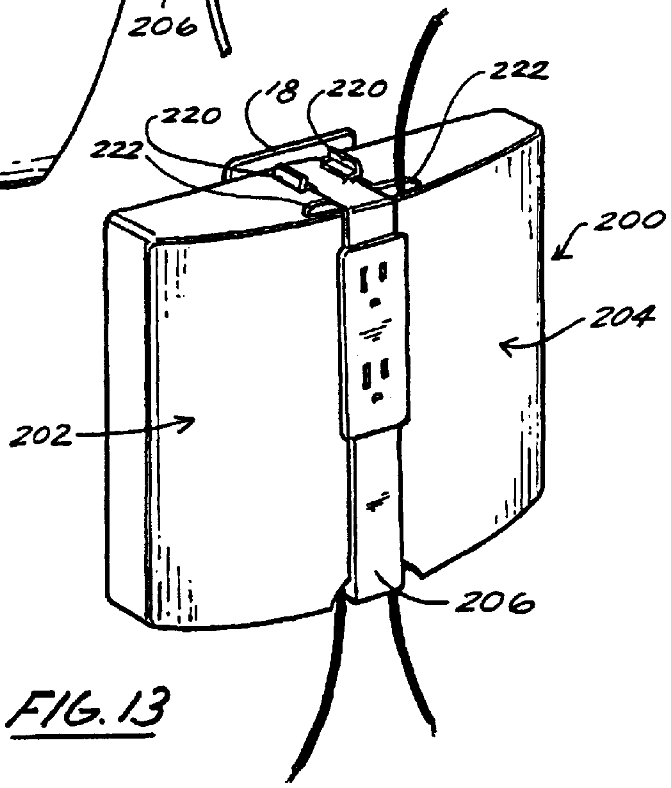
FIG. 13 is a schematic illustration of the plug-cord retainer unit of FIG. 12 in a closed position in accordance with a preferred embodiment of the present invention.

Referring now to FIGS. 12 and 13, which illustrate another embodiment of a plug-cord retainer unit 200 in accordance with the present invention. The plug-cord retainer unit 200 in this embodiment is intended for attachment to a conventional wall outlet 16 having a faceplate 18. The plug-cord retainer unit has a first side portion 202 and a second side portion 204. Each of the first side portion 202 and the second side portion 204 are attached to an opposing side of a plug block 206. The plug block 206 is preferably a six-receptacle unit having interior receptacles 208 on opposing sides of the plug block 206 that face a respective one of the first side portion 202 and the second side portion 204, as well as exterior receptacles 210, that face generally outwardly, as shown. However, a plug block with more or less receptacles may be utilized.

Each of the first and second side portions 202, 204 is hingeably attached to the plug block 206 by a doorstop 212 or other known mechanism. In this embodiment, each side portion 202, 204 may serve a different type of outlet and thus cross talk, which is one wire causing frequency noise to the other wire, is prevented by separating the side portions. The door stop or hinge 212 allows each of the side portions 202, 204 to swing to an open position exposing some of the interior receptacles 208 (FIG. 12) and then to a closed position covering all of the interior receptacles (FIG. 13). Each of the first and second side portions 202, 204 has a respective interior cavity 214 that allows for the storage of excess cord. As shown in FIG. 12, a plug 216 is inserted into one of the interior receptacles 208 and the excess cord 218 is stored in the interior cavity 214. In the closed position, a respective snap latch 220 maintains each of the first and second side portions 202, 204 in their closed position. Each of the first and second side portions 202, 204 has one or more notches 222 formed therein near its peripheral surface 224 to allow the cord 218 to pass therethrough when the side portions 202, 204 are latched in their closed position.

Figure 15:
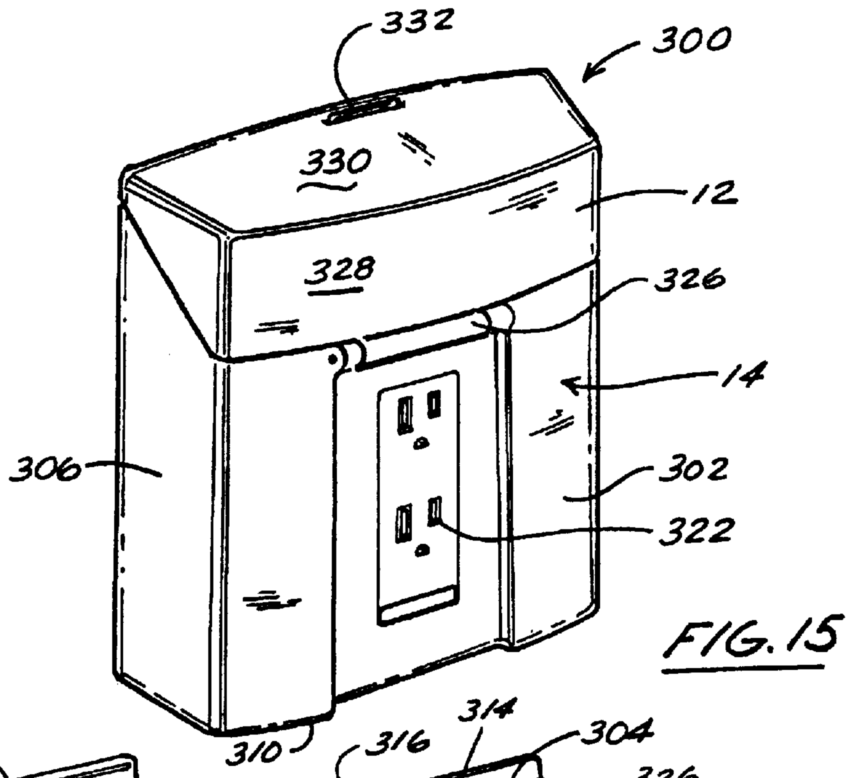
FIG. 15 is a schematic illustration of the unit of FIG. 14 in a closed position in accordance with a preferred embodiment of the present invention.
Figure 14:
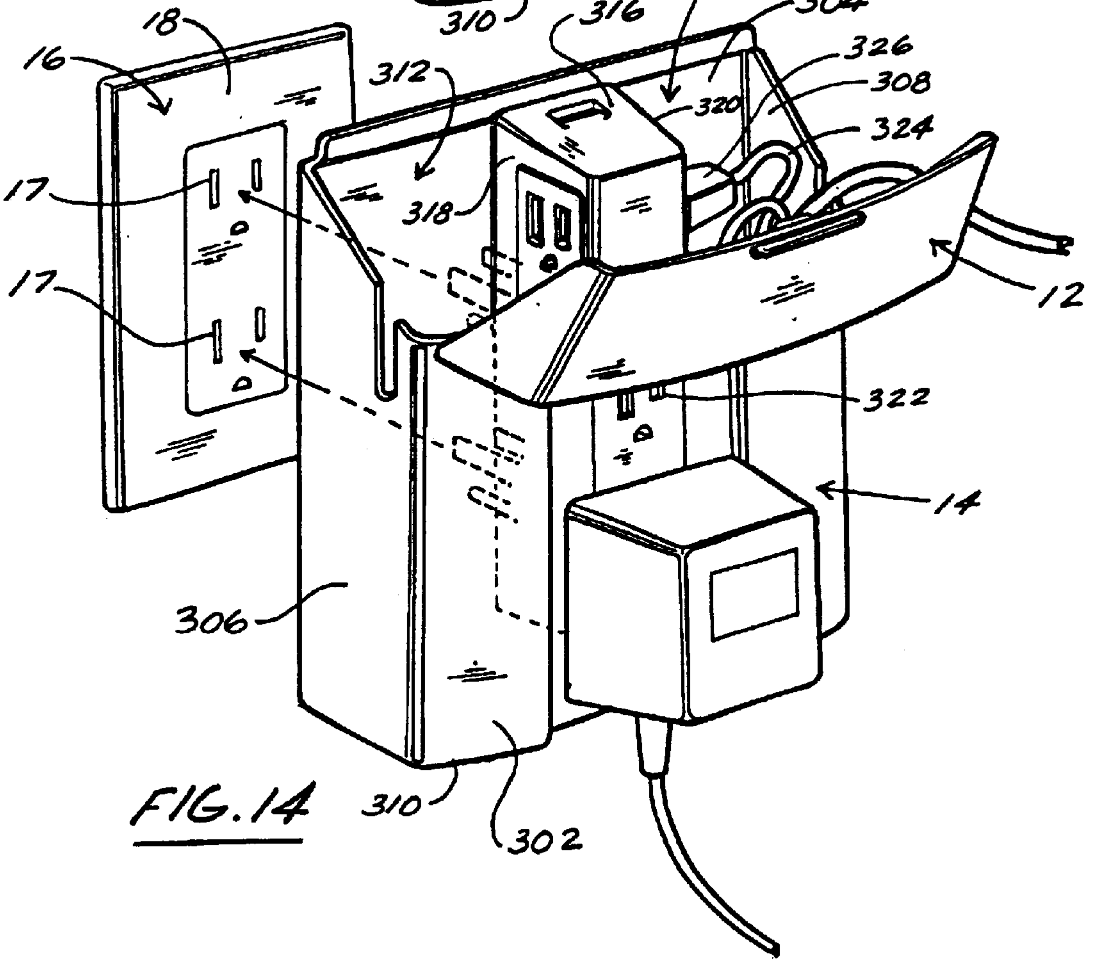
FIG. 14 is a schematic illustration of another embodiment of a plug-cord retainer unit in an open position and exploded from the wall outlet in accordance with a preferred embodiment of the present invention.

Referring now to FIGS. 14 and 15, which illustrate another embodiment of a plug-cord retainer unit 300 in accordance with the present invention. The plug-cord retainer unit 300 in this embodiment is intended for attachment to a conventional wall outlet 16 having a faceplate 18. However, as discussed above, the plug-cord retainer unit in this embodiment, as well as the other embodiments disclosed herein, can be attached to a variety of other structures, including phone jacks and computer network outlets. The plug-cord retainer unit has a cover portion 12 and a container portion 14. The container portion 14 has a front wall 302, a back wall 304, a pair of opposing side walls 306, 308, a bottom wall 310 and an open top 312. The container portion 14 defines an interior cavity 314 which is defined by the front wall 302, the back wall 304, the pair of opposing sidewalls 306, 308, the bottom wall 310 and the open top 312. The interior cavity 314 has a plug block 316 disposed in the middle thereof The plug block 316 has outlets formed on its side portions 318, 320, which face a respective one of the opposing sidewalls 306, 308. The outlets formed in the side portions 318, 320 of the plug block 316 are accessible when the unit 300 is in an open position. The plug block 316 also has exterior plug sockets 322 formed in the front wall 302, which are accessible from outside the retainer unit 300. The front wall 302 preferably has a recess 323 formed therein in which the exterior plug sockets 322 are disposed. The interior cavity 314 is intended to receive excess portions of the one or more extension cords 324 extending from a respective plug 326 inserted into the plug sockets formed on the sides 318 or 320.

The cover portion 12 is rotatably attached to the container portion 14 by a hinge 326 or other suitable mechanism. The cover portion 12 has a front face 328 and a top portion 330. The top portion 330 preferably engages the rear wall 304 and is secured thereto by a snap latch or other latching or locking mechanism 332. By this configuration, the interior cavity

314 is accessible by rotating the cover portion 12 from the closed position (FIG. 15) to an open position (FIG. 14).

Figure 16:
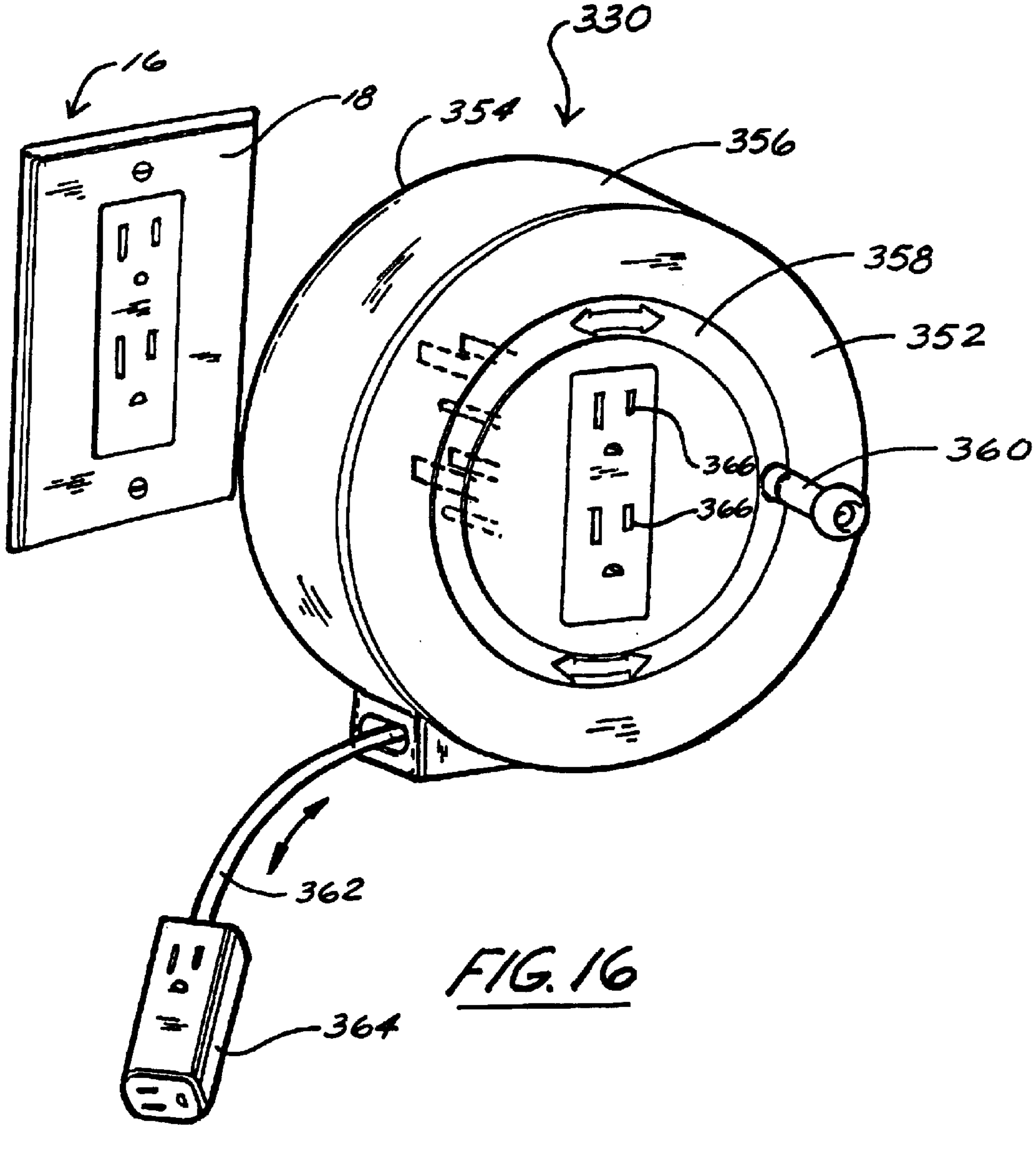
FIG. 16 is a schematic illustration of another embodiment of a plug-cord retainer unit exploded from the wall outlet in accordance with a preferred embodiment of the present invention.

Referring now to FIG. 16, which illustrates another embodiment of a plug-cord retainer unit 350 in accordance with the present invention. The plug-cord retainer unit 350 in this embodiment is also intended for attachment to a conventional wall outlet 16 having a face plate 18. The plug cord retainer unit 350 is generally circular in shape and has a front surface 352, a rear surface 354, and a generally cylindrical side surface 356 extending therebetween. The retainer unit 350 has a rotatable wheel 358 disposed therein that can be manually rotated through the use of a knob 360 attached to the wheel 358, which extends from the front surface 352 of the unit 350. Rotation of the wheel 358 through the use of the knob 360 causes a cord 362 connected to a plug 364 to be manually wound around the wheel 358. Conversely, pulling the plug 364 or the cord 362 or rotating the wheel 358 in the other direction will draw the cord from the interior of the unit 350 through the unwinding of the wheel 358. The front surface 352 of the unit 350 preferably has a plurality of exterior plug sockets 366 formed therein that are accessible when the unit 350 is plugged into the wall outlet 16.

It will be understood that each of the features from each of the embodiments shown and described above may be readily interchanged and/or added to any other embodiment and that the embodiments are not intended to be limiting. For example, vent or drain holes, while not specifically illustrated in connection with each embodiment, may be utilized in each embodiment. Moreover, any of the disclosed plug-cord retainer units or combinations thereof may also be utilized in connection with plug blocks, power strips, or other communication equipment, such as phone lines and network communications. The disclosed plug-cord retainer units are preferably for use in residential applications.

Having now fully described the invention, it will be apparent to one of ordinary skill in the art that many changes and modifications can be made thereto without departing from the spirit or scope of the invention as set forth herein.

What is claimed is:

1. A plug-cord retainer unit for attachment to a wall outlet having at least one plug socket and a faceplate comprising:

a container portion having an interior cavity configured to retain excess cord of a plug inserted into the at least one plug socket, the container portion having a rear wall, a front wall and a bottom surface generally defining the interior cavity, the rear wall having a passage formed therein to effectuate engagement with the wall outlet, the container portion having an opening in an upper region of the container portion to provide access to the interior cavity for locating the excess cord therein.

2. The plug-cord retainer unit of claim 1, further comprising a cover portion for mating engagement with the container portion at the opening.

3. The plug-cord retainer unit of claim 2, further comprising a latch mechanism to secure the container portion to the cover portion.

4. The plug-cord retainer unit of claim 2, wherein the cover portion is secured to an upper portion of the faceplate and wherein the container portion is slidable between an open position exposing the at least one plug socket and a closed position engaging the cover portion.

5. The plug-cord retainer unit of claim 2, wherein the cover portion is hingeably attached to the faceplate and rotates between an open position and a closed position.

6. The plug-cord retainer unit of claim 2, wherein the cover portion is hingeably attached to the container portion and rotates between an open position and a closed position.

7. The plug-cord retainer unit of claim 1, wherein the passage has a pair of opposing side portions, each of the pair of opposing side portions engaging a respective one of a pair of slots located on either side of the faceplate.

8. The plug-cord retainer unit of claim 7, wherein the pair of slots are integrally formed with the faceplate.

9. The plug-cord retainer unit of claim 7, wherein the pair of slots are separately attached to the wall outlet.

10. The plug-cord retainer unit of claim 1, wherein the container portion further comprises opposing sidewalls having at least one notch formed therein for allowing a portion of the cord to extend therefrom.

11. The plug-cord retainer unit of claim 1, further comprising at least one notch formed in the unit for allowing a portion of the cord to extend therefrom.

12. The plug-cord retainer unit of claim 11, wherein the at least one notch is in adjacent proximity to the at least one plug socket.

13. The plug-cord retainer unit of claim 1, further comprising a mounting device that fastens and engages with the container portion to allow easy attachment and removal of the retainer unit from a surface.

14. The plug-cord retainer unit of claim 1, wherein the faceplate is integrally formed with the rear wall and attaches directly to the wall outlet.

15. The plug-cord retainer unit of claim 1, wherein the rear wall is generally flat and the front wall is generally teardrop in shape such that the front wall engages a peripheral edge of the rear wall.

16. The plug-cord retainer unit of claim 1, wherein the bottom surface includes at least one drain hole formed therein to allow accumulated liquid to exit the interior cavity.

17. The plug-cord retainer unit of claim 1, further comprising a locking mechanism to prevent unwanted entry into the interior cavity of the container portion.

18. A plug-cord retainer unit for attachment to a wall outlet having at least one plug socket comprising:

a container portion having an upwardly facing interior cavity for retaining excess cord of a plug to be placed therein upon insertion of the plug into the at least one plug socket, the container portion having a rear wall and a front wall, the rear wall having a passage formed therein to effectuate engagement with the wall outlet; and a cover portion for mating engagement with the container portion to assist in hiding the excess cord of a plug inserted into the at least one plug socket.

19. The plug-cord retainer unit of claim 18, further comprising a faceplate.

20. The plug-cord retainer unit of claim 19, wherein the faceplate is integrally formed in the rear wall of the container portion.

21. The plug-cord retainer unit of claim 19, wherein the faceplate is separately attachable to the rear wall and the passage is shaped to receive the faceplate.

22. The plug-cord retainer unit of claim 21, wherein the passage comprises a pair of opposing side portions, each of the pair of opposing side portions engaging a respective one of a pair of sides to the faceplate.

23. The plug-cord retainer unit of claim 22, further comprising a pair of slots integrally formed with each side of the faceplate to effectuate engagement with the pair of opposing side portions.

24. The plug-cord retainer unit of claim 22, further comprising a pair of slots separately attached to each side of the faceplate to effectuate engagement with the pair of opposing side portions.

25. The plug-cord retainer unit of claim 19, wherein the cover portion is secured to an upper portion of the faceplate and wherein the container portion is slidable between an open position exposing the at least one plug socket and a closed position engaging the cover portion.

26. The plug-cord retainer unit of claim 19, wherein the cover portion is hingeably attached to the faceplate and rotates between an open position exposing the interior cavity and a closed position engaging the container portion.

27. The plug-cord retainer unit of claim 18, wherein the cover portion is hingeably attached to the container portion and rotates between an open position exposing the interior cavity and a closed position engaging the container portion.

28. The plug-cord retainer unit of claim 18, wherein the container portion further comprises a pair of opposing side walls and a bottom wall, and wherein the upwardly facing interior cavity is generally defined by the front wall, the rear wall, the opposing side walls, and the bottom wall.

29. The plug-cord retainer unit of claim 28, wherein at least one drain hole is formed in the bottom wall of the container portion to allow any accumulated liquid to exit the upwardly facing interior cavity.

30. The plug-cord retainer unit of claim 18, wherein the rear wall is generally flat and the front wall is generally teardrop in shape to engage a peripheral edge of the rear wall, the rear wall and the front wall defining the upwardly facing interior cavity.

31. The plug-cord retainer unit of claim 30, wherein at least one drain hole is formed in a bottom portion of the front wall to allow any accumulated liquid to exit the upwardly facing interior cavity.

32. The plug-cord retainer unit of claim 18, further comprising at least one notch formed in the unit for allowing a portion of the cord to extend therefrom.

33. The plug-cord retainer unit of claim 32, wherein the at least one notch is in adjacent proximity to the at least one plug socket.

34. The plug-cord retainer unit of claim 18, further comprising a latch mechanism to secure the container portion to the cover portion.

35. The plug-cord retainer unit for attachment to a wall outlet having at least one plug socket and a faceplate comprising:

a container portion having an interior cavity configured to retain excess cord of a plug inserted into the at least one plug socket, the container portion having a generally flat rear wall and a contoured front wall generally defining the interior cavity, the rear wall having a passage adapted to cooperate with the wall outlet, the front wall having an opening to provide access to the interior cavity for locating the excess cord therein.

36. The plug-cord retainer unit of claim 35, further comprising a cover portion for mating engagement with the opening of the container portion for enclosing the interior cavity.

37. The plug-cord retainer unit of claim 36, wherein the cover portion is hingeably attached to the container portion and rotates between an open position and a closed position.

38. The plug-cord retainer unit of claim 36, wherein the cover portion is slidably engaged with the container portion and is slidable between an open position and a closed position.

39. The plug-cord retainer unit of claim 35, wherein the rear wall is directly mounted to a wall surface surrounding the wall outlet.

40. The plug-cord retainer unit of claim 35, wherein the rear wall of the container portion is fastened to the faceplate.

41. The plug-cord retainer unit of claim 35, further comprising at least one notch formed in the unit for allowing a portion of the cord to extend therefrom.

42. The plug-cord retainer unit of claim 35, further comprising at least one drain hole formed therein to allow accumulated liquid to exit the interior cavity.

43. A plug-cord retainer unit for attachment to a wall outlet having at least one socket and a faceplate comprising:

a container portion having an interior cavity for storing excess cord of a plug inserted into the at least one plug socket, said container portion having a rear wall and a front wall;

an opening formed in said rear wall to effectuate engagement with the wall outlet; and a plug block having one or more external prongs for plugging into said at least one plug socket and one or more receiving outlets integrated into a side or sides of the plug block, said plug block being attached to said container portion.

44. A plug-cord retainer unit for use in managing at least one cord comprising:

a container portion having an interior cavity for storing excess portions of said at least one cord, said container portion having a rear wall and a front wall; and at least one plug socket disposed in the unit for attachment of at least one plug cord;

said at least one plug socket being part of a plug block having one or more external prongs for plugging into said at least one plug socket of a conventional wall outlet.

45. A plug-cord container unit for use in concealing excess plug cords, comprising:

a container portion having an interior cavity for receiving the excess plug cords, said container having a front wall, a rear wall, and a bottom wall;

at least one plug socket disposed in the unit for attachment of at least one plug thereto; and a plug receptacle device disposed in said container portion, said plug receptacle device having a plurality of plug sockets formed therein for receipt of one or more plugs and having a plurality of prongs for engaging one or more plug sockets of a conventional wall outlet.

46. A plug-cord retainer unit for use in concealing excess plug cords, comprising:

a container portion having an interior cavity for receiving the excess plug cords, said container portion having a front wall, rear wall, and a bottom wall; and at least one plug block disposed in the unit for attachment of at least one plug thereto;

wherein said plug block includes a plurality of prongs for engaging one or more plug sockets of a conventional wall outlet.

* * * * *